(12) United States Patent
Su et al.

(10) Patent No.: US 12,543,454 B2
(45) Date of Patent: Feb. 3, 2026

(54) DISPLAY PANEL AND DISPLAY APPARATUS

(71) Applicants: Hefei Xinsheng Optoelectronics Technology Co., Ltd., Anhui (CN); BOE TECHNOLOGY GROUP CO., LTD., Beijing (CN)

(72) Inventors: Tongshang Su, Beijing (CN); Jun Cheng, Beijing (CN); Yongchao Huang, Beijing (CN); Jun Liu, Beijing (CN); Liangchen Yan, Beijing (CN); Haitao Wang, Beijing (CN)

(73) Assignees: Hefei Xinsheng Optoelectronics Technology Co., Ltd., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 423 days.

(21) Appl. No.: 18/022,189

(22) PCT Filed: Apr. 21, 2022

(86) PCT No.: PCT/CN2022/088061
§ 371 (c)(1),
(2) Date: Feb. 20, 2023

(87) PCT Pub. No.: WO2023/201602
PCT Pub. Date: Oct. 26, 2023

(65) Prior Publication Data
US 2024/0276793 A1 Aug. 15, 2024

(51) Int. Cl.
*H10K 59/124* (2023.01)
*H10K 59/80* (2023.01)
*H10K 59/123* (2023.01)

(52) U.S. Cl.
CPC ..... *H10K 59/124* (2023.02); *H10K 59/80515* (2023.02); *H10K 59/123* (2023.02)

(58) Field of Classification Search
CPC .................................................. H10K 59/124
See application file for complete search history.

(56) References Cited

U.S. PATENT DOCUMENTS

| | | | |
|---|---|---|---|
| 2012/0074435 A1* | 3/2012 | Ha ....................... | H10K 50/828 257/E33.012 |
| 2016/0035809 A1* | 2/2016 | Park ..................... | H10K 59/121 257/40 |

(Continued)

FOREIGN PATENT DOCUMENTS

| | | | | |
|---|---|---|---|---|
| CN | 1690810 A | * | 11/2005 | ....... G02F 1/133512 |
| CN | 110716358 A | | 1/2020 | |

(Continued)

OTHER PUBLICATIONS

Machine translation of CN-1690810-A (Year: 2005).*

*Primary Examiner* — Bryan R Junge
(74) *Attorney, Agent, or Firm* — HOUTTEMAN LAW LLC

(57) ABSTRACT

The embodiment of the present disclosure provides a display panel and a display apparatus, the display panel includes a base substrate, an electrode layer and a planarization layer. The electrode layer includes a plurality of repeating units, each of which includes at least one electrode set, each of the electrode set includes a plurality of electrode blocks arranged along a first direction, each of the electrode blocks includes a plurality of first electrodes arranged along the first direction and a connection electrode connected between every two adjacent first electrodes. The planarization layer is provided with a plurality of grooves, a corresponding groove of the plurality of grooves is on at least one side of the repeating unit in a second direction. The groove includes a first sidewall extending along the first direction, and at least a portion of the connection electrode is on the first sidewall.

15 Claims, 6 Drawing Sheets

(56) References Cited

U.S. PATENT DOCUMENTS

| | | | |
|---|---|---|---|
| 2016/0322437 A1 | 11/2016 | Sakamoto et al. | |
| 2018/0076411 A1* | 3/2018 | Kim | H10K 59/121 |
| 2020/0066817 A1* | 2/2020 | Kim | H10K 59/123 |
| 2020/0212131 A1* | 7/2020 | Kim | H10K 59/1315 |
| 2021/0013296 A1 | 1/2021 | Ochi et al. | |
| 2021/0091152 A1* | 3/2021 | Yang | H10K 59/123 |
| 2021/0143373 A1* | 5/2021 | Kim | H10K 71/00 |
| 2022/0199746 A1* | 6/2022 | Kim | H10K 50/865 |

FOREIGN PATENT DOCUMENTS

| | | |
|---|---|---|
| CN | 111584757 A | 8/2020 |
| CN | 113540194 A | 10/2021 |
| CN | 113937144 A | 1/2022 |
| CN | 114156330 A | 3/2022 |

\* cited by examiner

DISPLAY PANEL AND DISPLAY APPARATUS

TECHNICAL FIELD

The present disclosure relates to the technical field of display, in particular, to a display panel and a display apparatus.

BACKGROUND

Organic Light emitting Diode (OLED) devices are electroluminescent devices based on organic semiconductor materials, which have high Light conversion efficiency and very low power consumption. Meanwhile, with the development of the information society, a novel display technology such as a transparent display apparatus also obtains good user experience, and has a wide market prospect.

In the transparent display apparatus, the larger the area of the transparent region, the higher the light transmittance, and the sharper the image observed through the panel.

SUMMARY

Embodiments of the present disclosure provides a display panel and a display apparatus As a first aspect, an embodiment of the present disclosure provides a display panel, including a base substrate, an electrode layer and a planarization layer between the base substrate and the electrode layer. The electrode layer includes a plurality of repeating units, each of the plurality of repeating units includes at least one electrode set, each of the at least one electrode set includes a plurality of electrode blocks arranged along a first direction, each of the plurality of electrode blocks includes a plurality of first electrodes arranged along the first direction and a connection electrode connected between every two adjacent ones of the plurality of first electrodes. The planarization layer is provided with a plurality of grooves, a corresponding groove of the plurality of grooves is on at least one side of the repeating unit in a second direction, the groove includes a first sidewall extending along the first direction, and at least a portion of the connection electrode is on the first sidewall; the second direction intersecting the first direction. The planarization layer further includes a plurality of first protrusions, orthographic projections of the plurality of first protrusions on the base substrate each cover in the second direction an orthographic projection of the first sidewall on the base substrate, and a corresponding one of the plurality of first protrusions is between the connection electrodes of at least two adjacent electrode blocks in the same electrode set.

In some embodiments, an edge of the first sidewall proximal to the base substrate includes a first portion, an edge of the first sidewall away from the base substrate includes a second portion, each of the first portion and the second portion extends along the first direction, and an orthographic projection of each of the first portion and the second portion on the base substrate does not overlap the orthographic projection of the first protrusion on the base substrate. An orthographic projection of an extension line of the second portion on the base substrate passes through the orthographic projection of the first protrusion on the base substrate.

In some embodiments, the display panel further includes a plurality of first cushion blocks between the base substrate and the planarization layer, and
an orthographic projection of each of the plurality of first protrusions on the base substrate covers an orthographic projection of a corresponding one of the plurality of first cushion blocks on the base substrate.

In some embodiments, the display panel further includes a thin film transistor between the planarization layer and the base substrate. The first electrode is electrically connected to a drain electrode of the thin film transistor through a via hole in the planarization layer, and the plurality of first cushion blocks are made of the same material as the drain electrode or a gate electrode of the thin film transistor.

In some embodiments, each of the plurality of repeating units includes two electrode sets arranged in the second direction, and the connection electrodes of the two electrode sets are respectively located in two adjacent grooves arranged in the second direction among the plurality of grooves.

In some embodiments, an orthographic projection of the first protrusion on the base substrate does not overlap an orthographic projection of the first electrode on the base substrate.

In some embodiments, the groove further includes a second sidewall extending along the second direction. The planarization layer further includes at least one second protrusion, and an orthographic projection of the at least one second protrusion on the base substrate covers in the first direction an orthographic projection of the second sidewall on the base substrate.

In some embodiments, the display panel further includes a plurality of second cushion blocks each between the base substrate and the planarization layer, wherein an orthographic projection of each of the at least one second protrusion on the base substrate covers an orthographic projection of a corresponding one of the plurality of second cushion blocks on the base substrate.

In some embodiments, the display panel further includes a thin film transistor between the planarization layer and the base substrate. The plurality of second cushion blocks are made of the same material as a drain electrode or a gate electrode of the thin film transistor.

In some embodiments, the display panel further includes a plurality of light emitting devices, each of which includes the first electrode, a light emitting layer, and a second electrode, the second electrode being located on a side of the first electrode away from the base substrate, the light emitting layer being located between the first electrode and the second electrode. The light emitting layers corresponding to the plurality of first electrodes in the same electrode block emit light in a same color.

In some embodiments, the plurality of repeating units are arranged in an array, one of the first direction and the second direction is a row direction, and the other is a column direction; and the groove is between every two adjacent ones in the second direction of the plurality of repeating units.

In some embodiments, an angle between the first sidewall and a bottom of the groove ranges from 110° to 170°.

In some embodiments, a corresponding one of the plurality of first protrusions is located in a spacing region between every two adjacent electrode blocks in the same electrode set.

In some embodiments, the plurality of first electrodes and the connection electrode in the same electrode block are formed as a one-piece structure.

As a second aspect, an embodiment of the present disclosure provides a display apparatus including the display panel described according to the first aspect.

BRIEF DESCRIPTION OF DRAWINGS

The accompanying drawings, which are incorporated in and constitute a part of this specification to provide a further understanding of the present disclosure, are used for illustrating the present disclosure together with the embodiments describe hereinafter, but do not constitute a limitation of the present disclosure. In the drawings.

DETAIL DESCRIPTION OF EMBODIMENTS

Figure 1:
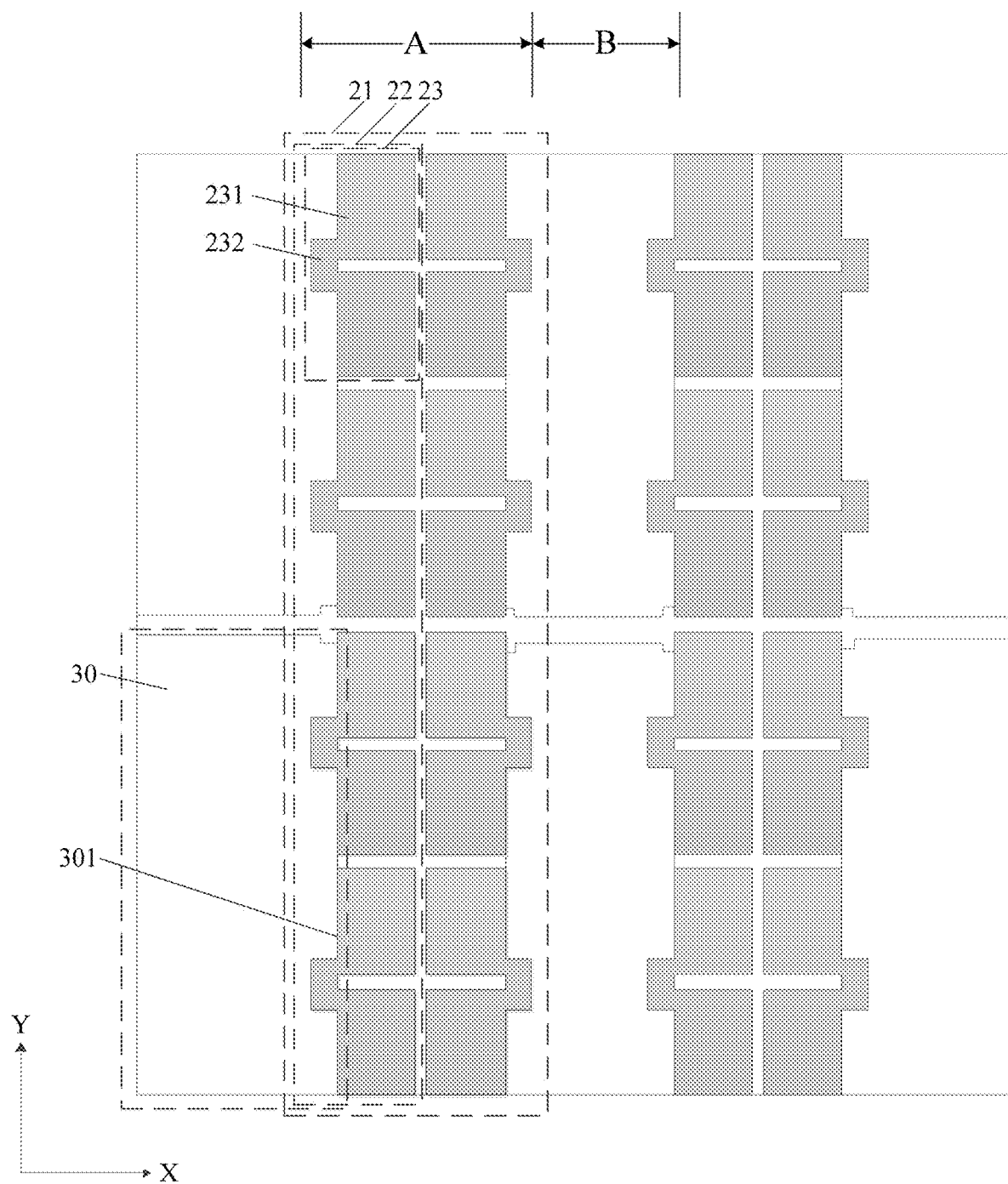
FIG. 1 is a plan view of a display panel.

The present disclosure will now be described in detail with reference to the following examples. It should be noted that, the specific embodiments described herein are only used to illustrate and explain the present disclosure rather than limiting the present disclosure In order to make the objects, technical solutions and advantages of the embodiments of the present disclosure more apparent, the technical solutions of the embodiments of the present disclosure will be clearly and completely described below with reference to the drawings of the embodiments of the present disclosure. It is to be understood that the described embodiments are only a few embodiments of the present disclosure, and not all embodiments. All other embodiments, which can be derived by a person skilled in the art from the described embodiments of the present disclosure without inventive step, are within the scope of protection of the present disclosure.

Unless otherwise defined, technical or scientific terms used in the embodiments of the present disclosure should have the ordinary meaning as understood by one of ordinary skill in the art to which the present disclosure belongs. The use of "first," "second," and the like in this disclosure is not intended to indicate any order, quantity, or importance, but rather is used to distinguish one element from another. Similarly, the word "include" or "comprise", and the like, means that the element or item preceding the word comprises the element or item listed after the word and its equivalent, but does not exclude other elements or items. The terms "connect" or "couple" and the like are not restricted to physical or mechanical connections, but may include electrical connections, whether direct or indirect. "Upper", "lower", "left", "right", and the like are used only to indicate relative positional relationships, and when the absolute position of the object being described is changed, the relative positional relationships may also be changed accordingly.

In organic light emitting diode (OLED) display panels, a light emitting device and a pixel driving circuit for providing a driving current to the light emitting device are disposed in each pixel. The pixel driving circuit includes a plurality of thin film transistors, a planarization layer is disposed between the pixel circuit and the light emitting device, and the light emitting device is connected to the thin film transistor in the pixel driving circuit through a via hole in the planarization layer. The OLED display panel may be used as a transparent display panel, thereby providing a better experience for a user. The transparent display panel is a display panel itself having a certain degree of light transmittance, so that the user can see not only images displayed on the display panel but also pictures behind the display panel. At present, transparent display panels have been widely used in vehicle-mounted display for vehicles and subways, window displays for hotels and clothing stores, and Augmented Reality (AR) display and Virtual Reality (VR) display, and the like.

Since the application scene and the display effect of the transparent display panels are greatly influenced by the external light environment, a better display effect cannot be obtained under a poorer illumination condition. Therefore, in general, in a region where no light emitting device is disposed, the planarization layer is hollowed to form a groove, so as to improve the display effect of the transparent display panel.

FIG. 1 is a plan view of a display panel. As shown in FIG. 1, the display panel includes a display region A and a transparent region B alternately arranged in a second direction X. A portion of the planarization layer located in the transparent region is hollowed out to form a groove/trench 30. A plurality of light emitting devices are disposed in the display region, each of the plurality of light emitting devices includes a first electrode 231 and a second electrode disposed opposite to each other and a light emitting layer therebetween. Only the first electrode 231 of the light emitting device is shown in the FIG. 1. The plurality of light emitting devices in the display region are divided into a plurality of repeating units 21 each of which includes at least one electrode set 22, each of the electrode set 22 includes a plurality of electrode blocks 23 arranged in the first direction Y, and each of the electrode blocks 23 includes a plurality of first electrodes 231 arranged in the first direction Y.

As shown in FIG. 1, the light emitting layers corresponding to the plurality of first electrodes 231 in each electrode block 23 have the same light emitting color, and the adjacent first electrodes 231 are connected to each other via a connection electrode 232. That is, the multiple light emitting devices corresponding to the plurality of first electrodes 231 in the same electrode block are configured to emit light in the same color, and the plurality of first electrodes 231 are connected to each other via the connection electrode 232. When one of the multiple light emitting devices fails, resulting in poor display, the light emitting devices corresponding to other first electrodes 231 in the same electrode block 23 can still display normally, so that the negative influence on the overall display effect of the display panel can be avoided. For example, when one of the light emitting devices fails, the first electrode 231 of the faulty light emitting device may be disconnected from the connection electrode 232.

Figure 2:
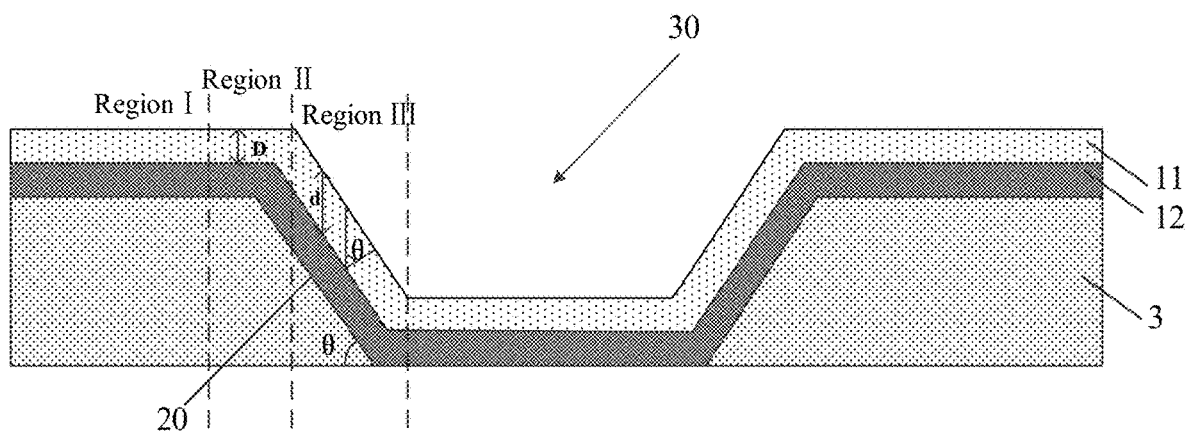
FIG. 2 is a schematic diagram showing a structure of a planarization layer.

FIG. 2 is a schematic diagram showing a structure of a planarization layer. As shown in FIG. 2, due to process limitations, the hollow planarization layer has a certain thickness, so that the sidewall 20 of the groove that is completely parallel to a thickness direction of the display panel cannot be formed, but a sidewall 20 of the groove that has a certain inclination angle with regard to the thickness direction of the display panel is formed. For example, an included angle θ is formed between the sidewall 20 of the groove and a plane where the bottom of the groove 30 is located.

During the manufacture of the display panel, the first electrode 231 is formed through a photolithography patterning process after the planarization layer is formed. Specifically, a conductive material layer 12 and a photoresist (PR) layer 11 are sequentially formed on the planarization layer. The material of the conductive material layer 12 may be Indium Tin Oxide (ITO). And then, the photoresist layer 11 is exposed and developed, so as to remove the photoresist in some regions. A portion of the conductive material layer which is not covered by the photoresist is etched to form a pattern of the first electrode. In this process, as shown in FIG. 2, the conductive material in region I needs to be retained, and the photoresist in region I does not need to be exposed; the conductive material in region II needs to be etched through an exposure process, and a thickness of the photoresist needed to be removed through the exposure process is D under the condition of certain light quantity; the portion of the photoresist layer 11 in the region III also needs to be remove through an exposure process. Since the region III is a region where the sidewall 20 of the groove is located and an included angle θ is formed between the sidewall and the plane where the bottom of the groove is located, the photoresist in the region III that needs to be removed through the exposure process has a thickness of $d=D/\cos\theta$.

From the above analysis, it is apparent that the thickness d of the photoresist layer 11 in region III that needs to be removed through the exposure process is greater than the thickness D of the photoresist layer 11 in region II that needs to be removed through the exposure process. That is, under a certain exposure, the photoresist layer 11 on the sidewall 20 of the groove may be insufficiently exposed, and a photoresist residue may be formed on the sidewall 20 of the groove after the exposure process. The photoresist residue may further cause incomplete etching of the conductive material layer 12, thereby eventually forming a residue of the conductive material layer 12 on the sidewalls 20 of the groove.

As shown in FIG. 1, at least a portion of each of the connection electrodes 232 of the plurality of electrode blocks 23 in the same electrode set 22 is located on the sidewall 20 of the groove and the conductive material on the sidewall 20 of the groove is etched incompletely, therefore the connection electrodes 232 of different electrode blocks 23 are connected to each other. Since the light emitting layers corresponding to the first electrodes 231 in the different electrode blocks 23 emit light in different colors, the connection between the connection electrodes 232 may cause cross color between the electrode blocks 23 emitting light in different colors, thereby affecting the display effect of the display panel.

In order to solve at least one of the above technical problems, embodiments of the present disclosure provide a display panel, which improves or avoids connection of first electrodes of light emitting devices emitting light in different colors due to residual conductive materials formed on sidewalls of grooves, so as to improve or avoid the cross color phenomenon in the display panel, and improve the display effect of the display panel.

Figure 3:
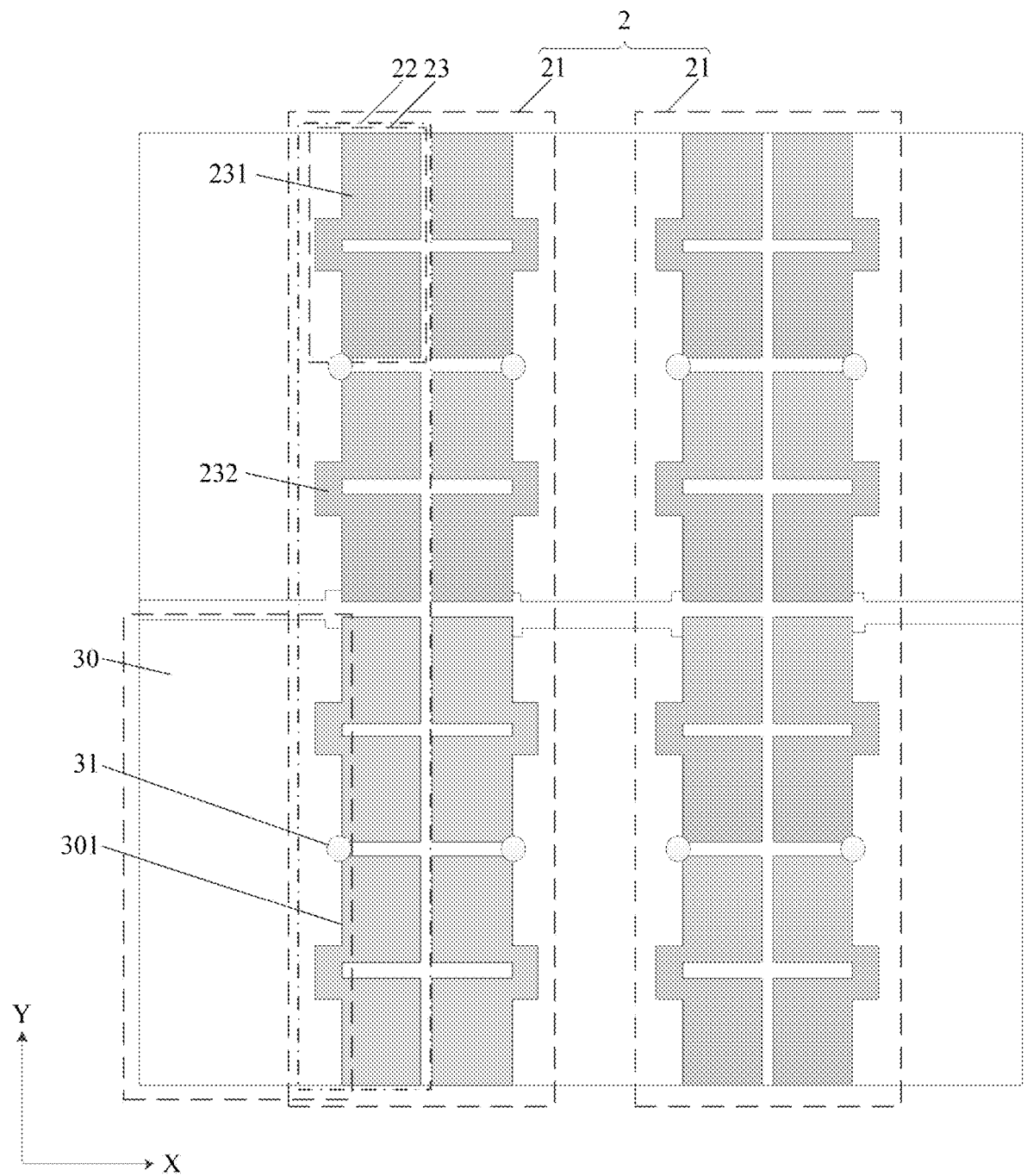
FIG. 3 is a plan view showing a structure of a display panel according to an embodiment of the present disclosure.
Figure 4:
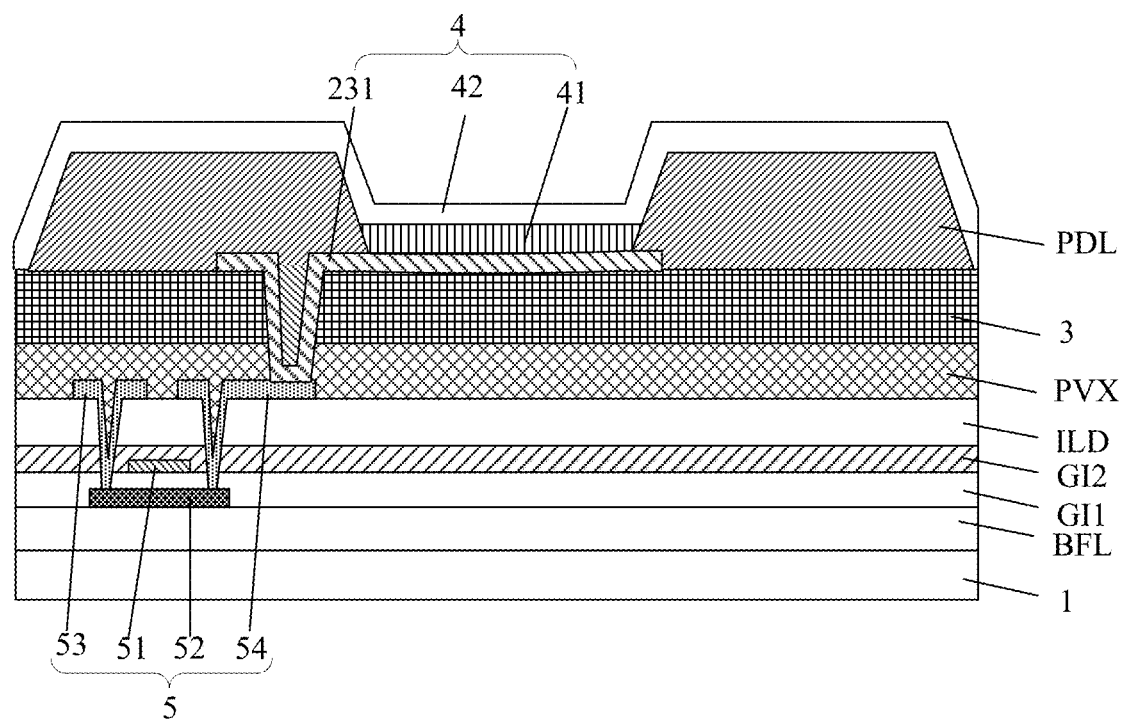
FIG. 4 is a cross-sectional view of a part of a display panel according to an embodiment of the present disclosure.

FIG. 3 is a plan view showing a structure of a display panel in an embodiment of the present disclosure, and FIG. 4 is a cross-sectional view of a part of the display panel in the embodiment of the present disclosure. As shown in FIG. 3 and FIG. 4, the display panel includes: a base substrate 1, an electrode layer 2, and a planarization layer 3 located between the base substrate 1 and the electrode layer 2.

Figure 5:
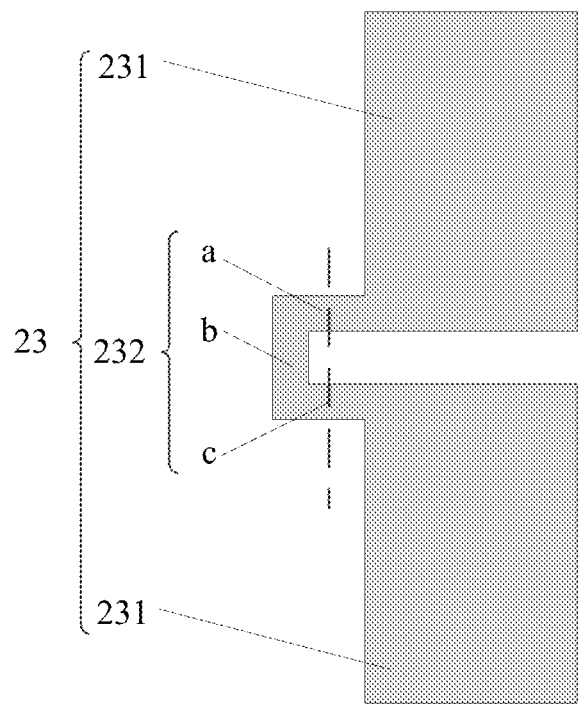
FIG. 5 is a schematic plan view showing an electrode block in an embodiment of the present disclosure.

The electrode layer 2 includes a plurality of repeating units 21, each of the repeating units 21 includes at least one electrode set 22, and each of the electrode set 22 includes a plurality of electrode blocks 23 arranged along the first direction Y. FIG. 5 is a schematic plan view of an electrode block in an embodiment of the present disclosure. As shown in FIG. 3 and FIG. 5, each of the electrode blocks 23 includes a plurality of first electrodes 231 arranged along the first direction Y and a connection electrode 232 connected between every two adjacent first electrodes 231.

Figure 6:
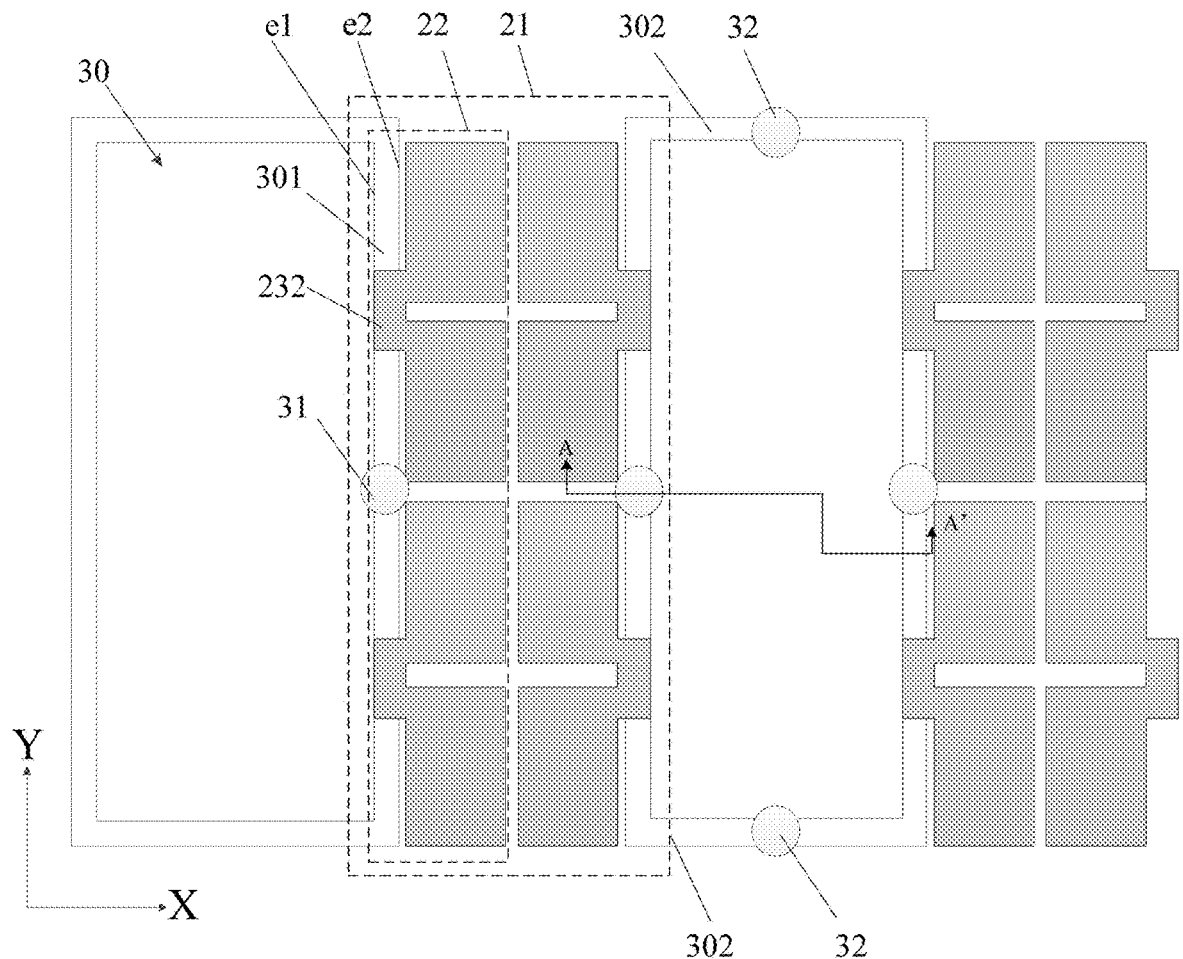
FIG. 6 is a plan view showing a structure of a display panel in another embodiment of the present disclosure.

FIG. 6 is a plan view showing a structure of a display panel in another embodiment of the present disclosure. As shown in FIG. 3 and FIG. 6, the planarization layer 3 has a plurality of grooves 30 therein. At least one side of the repeating unit 21 in the second direction X has a groove 30. The groove 30 has a first sidewall 301 extending along the first direction Y, and at least a portion of the connection electrode 232 is located on the first sidewall 301, the second direction X intersecting the first direction Y, it should be noted that the first sidewall 301 extending in the first direction Y means that an orthographic projection of the first sidewall 301 on the base substrate 1 extends substantially in the first direction Y.

The planarization layer 3 further has a plurality of first protrusions 31, orthographic projections of the first protrusions 31 on the base substrate 1 cover in the second direction X an orthographic projection of the first sidewall 301 on the base substrate 1. At least one first protrusion 31 is disposed between the connection electrodes 232 of at least two adjacent electrode blocks 23 in the same electrode set 22.

Figure 7:
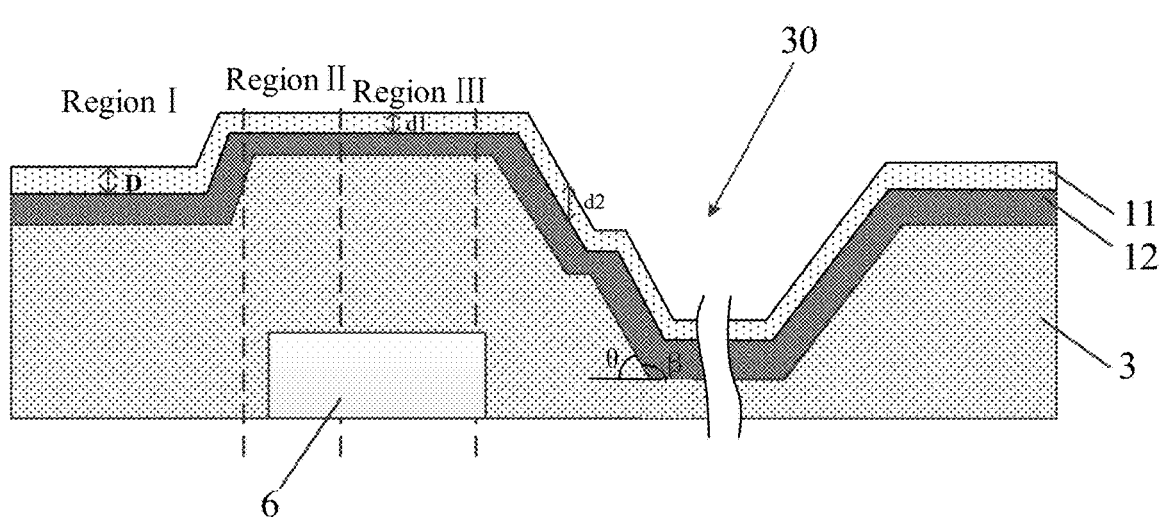
FIG. 7 is a schematic diagram showing the formation of a first electrode layer according to an embodiment of the present disclosure.

The display panel in the embodiment of the present disclosure has a plurality of first protrusions 31 on the planarization layer 3, and the orthographic projections of the first protrusions 31 on the base substrate 1 overlap the orthographic projection of the first sidewall 301 on the base substrate 1. That is, at least a portion of the first protrusion 31 is formed on the first sidewall 301. FIG. 7 is a schematic diagram showing the formation of a first electrode layer according to an embodiment of the present disclosure. FIG. 7 shows a cross-sectional view of the planarization layer 3 along line AA' in FIG. 6. Similar to FIG. 2, in FIG. 7 the conductive material layer in region I needs to retain, and the photoresist in region I does not need to be exposed. The conductive material layer in region II needs to be etched away through an exposure process. Further, the conductive material layer in region III needs to be etched away through an exposure process. During the manufacture of the electrode layer through the photolithography process, the photoresist layer is formed by curing a paste having fluidity. When the photoresist layer 11 is coated on the planarization layer 3, the photoresist layer 11 in the region I has a thickness of D. Since the first protrusion 31 protrudes with respect to other portions in the thickness direction of the display panel, the photoresist layer 11 in region II has a thickness smaller than that of other portions of the photoresist layer 11. That is, the photoresist layer 11 in region II has a thickness d1 smaller than the thickness D of the photoresist layer 11 in region I. The photoresist layer 11 in region III has a thickness of $d2=d1/\cos\theta$. As compared with the thickness d of the photoresist layer 11 in region III in FIG. 2, the thickness d2 of the photoresist layer 11 to be exposed on the first sidewall 301 after the first protrusion 31 is formed is much thinner. Therefore, the photoresist residue can be completely removed after exposure treatment, the formation of the photoresist residue can be avoided, the residue of the conductive material cannot be formed when the conductive material layer 12 is further etched. The occurrence of connection between the electrode blocks due to incomplete etching of the conductive material layer cannot occur, and in turn the cross color phenomenon during display caused by short circuit of the first electrodes of the light emitting devices in different colors can be avoided, so that the display effect of the display panel can be improved.

In some embodiments, as shown in FIG. 3, the display panel includes a plurality of repeating units 21 arranged in an array, i.e., arranged in rows and columns. One of the first direction Y and the second direction X is a row direction, and the other is a column direction. A groove 30 is formed between every two adjacent repeating units 21 in the second direction X, thereby improving the transparent display effect of the display panel.

In some embodiments, as shown in FIG. 3, the first electrode 231 and the connection electrode 232 in the same electrode block 23 are connected to each other to form a one-piece structure. That is, the first electrode 231 and the connection electrode 232 can be formed simultaneously during the manufacturing process of the display panel, so as to simply the manufacturing of the display panel.

In some embodiments, as shown in FIG. 4, the display panel further includes a plurality of light emitting devices 4 and a plurality of thin film transistors 5. The thin film transistor 5 is located between the planarization layer 3 and the base substrate 1 and includes a gate electrode 51, an active layer 52, a source electrode 53, and a drain electrode 54. The first electrode 231 may be an anode of the light emitting device 4 and is electrically connected to the drain electrode 54 through a via hole in the planarization layer 3.

As shown in FIG. 4, in an embodiment in which the thin film transistor 5 is a top-gate thin film transistor. The active layer 52 is located between the gate electrode 51 and the base substrate 1. The material of the active layer 52 may include, for example, an inorganic semiconductor material (e.g., polysilicon, amorphous silicon, etc.), an organic semiconductor material, an oxide semiconductor material. The active layer 52 includes a channel and source and drain connection portions on both sides of the channel. The source connection portion is connected to the source electrode 53 of the thin film transistor 5, and the drain connection portion is connected to the drain electrode 54 of the thin film transistor 5. Each of the source connection portion and the drain connection portion may be doped with an impurity (e.g., an N-type impurity or a P-type impurity) having a higher impurity concentration than that of the channel. The channel faces the gate electrode 51 of the thin film transistor 5. When a voltage signal applied to the gate electrode 51 reaches a predetermined value, a carrier path is formed in the channel, so that the source electrode 53 and the drain electrode 54 of the thin film transistor 5 are put through to each other.

The buffer layer BFL is disposed between the thin film transistor 5 and the base substrate 1 to prevent or reduce diffusion of metal atoms and/or impurities from the base substrate 1 into the active layer 52 of the transistor. The buffer layer BFL may include an inorganic material such as silicon oxide, silicon nitride, and/or silicon oxynitride, and may have a single-layer or multi-layer structure.

The first gate insulating layer GI1 is disposed on a side of the active layer 52 away from the base substrate 1. The material of the first gate insulating layer GI1 may include a silicon compound and a metal oxide. For example, the material of the first gate insulating layer GI1 includes silicon oxynitride, silicon oxide, silicon nitride, silicon oxycarbide, silicon carbonitride, aluminum oxide, aluminum nitride, tantalum oxide, hafnium oxide, zirconium oxide, titanium oxide, or the like. In addition, the first gate insulating layer GI1 may have a single-layer or multi-layer structure.

The gate electrode layer is formed on a side of the first gate insulating layer GI1 away from the base substrate 1. The gate electrode layer includes at least the gate electrodes 51 of the thin film transistors. The material of the gate electrode layer may include, for example, metal, metal alloy, metal nitride, conductive metal oxide, transparent conductive material, or the like. For example, the gate electrode layer may include gold, gold alloy, silver, silver alloy, aluminum, aluminum alloy, aluminum nitride, tungsten, tungsten nitride, copper, copper alloy, nickel, chromium, chromium nitride, molybdenum, molybdenum alloy, titanium, titanium nitride, platinum, tantalum, tantalum nitride, neodymium, scandium, strontium ruthenium oxide, zinc oxide, tin oxide, indium oxide, gallium oxide, indium tin oxide, indium zinc oxide, etc. The gate electrode layer may have a single-layer or multi-layer structure.

The second gate insulating layer GI2 is formed on a side of the gate electrode layer away from the base substrate 1, and a material of the second gate insulating layer GI2 may include, for example, a silicon compound or a metal oxide. For example, the material of the second gate insulating layer GI2 may include silicon oxynitride, silicon oxide, silicon nitride, silicon oxycarbide, silicon carbonitride, aluminum oxide, aluminum nitride, tantalum oxide, hafnium oxide, zirconium oxide, titanium oxide, or the like. The second gate insulating layer GI2 may have a single-layer or multi-layer structure.

An interlayer insulating layer ILD is formed on a side of the second electrode plate of the capacitor away from the base substrate 1, and a material of the interlayer insulating layer ILD may include, for example, a silicon compound, a metal oxide, or the like. In particular, the silicon compounds and metal oxides listed above may be selected as the material of the interlayer insulating layer ILD and will not be described in detail herein.

The source-drain conductive layer is formed on a side of the interlayer insulating layer ILD away from the base substrate 1. The source-drain conductive layer may include a source electrode 53 and a drain electrode 54 of the transistor, wherein the source electrode 53 is electrically connected to the source connection portion, and the drain electrode 54 is electrically connected to the drain connection portion. The source-drain conductive layer may include metals, alloys, metal nitrides, conductive metal oxides, transparent conductive materials, or the like. For example, the source-drain conductive layer may have a single-layer or multiple-layer structure made of metal, such as Mo/Al/Mo or Ti/Al/Ti.

A passivation layer PVX is formed on a side of the source-drain conductive layer away from the base substrate 1, and a material of the passivation layer PVX may include, for example, silicon oxynitride, silicon oxide, silicon nitride, or the like. The planarization layer 3 is formed on a side of the passivation layer PVX away from the base substrate 1, and the planarization layer 3 may be made of an organic insulating material, for example resin materials such as polyimide, epoxy, acryl, polyester, photoresist, polyacrylate, polyamide, or siloxane.

The pixel defining layer PDL is formed on a side of the planarization layer 3 away from the base substrate 1, and includes a plurality of accommodating portions in one-to-one correspondence with the light emitting devices 4.

Each of the light emitting devices 4 includes a first electrode 231, a light emitting layer 41, and a second electrode 42, the second electrode 42 being located on a side of the first electrode 231 away from the base substrate 1. The light emitting layer 41 is located between the first electrode 231 and the second electrode 42. The light emitting layers 41 corresponding to the plurality of first electrodes 231 in the same electrode block 23 emit light in the same color. The adjacent first electrodes 231 are connected to each other via a connection electrode 232.

In some embodiments, as shown in FIG. 5, the connection electrode 232 includes a first electrode bar a, a second electrode bar b and a third electrode bar c. The first electrode bar a and the third electrode bar c are respectively connected to the two first electrodes 231, and two ends of the second electrode bar b are respectively connected to the first electrode bar a and the third electrode bar c. When one of the light emitting devices 4 configured to emit light in the same color fails to display images, the faulty device is removed by cutting the first electrode bar a, the second electrode bar b, and the third electrode bar c at any position (e.g., a dotted line shown in FIG. 5) on the first electrode bar a, the second electrode bar b, and the third electrode bar c, so that the normal light emitting devices corresponding to the other first electrodes in the same electrode block 23 may still emit light normally, so as to avoid affecting the overall display effect of the display panel.

Optionally, the first electrode 231 is an anode and the second electrode 42 is a cathode. The light emitting layer 41 may include a hole injection layer, a hole transport layer, a light emitting layer, an electron transport layer, and an electron injection layer stacked sequentially. The first electrode 231 is located between the pixel defining layer PDL and the planarization layer 3. The second electrodes 42 of the plurality of light emitting devices 4 may be formed as a one-piece structure.

Optionally, the light emitting device 4 is an OLED device, and in this case, the light emitting layer is made of an organic light emitting material. Alternatively, the light emitting device 4 is a quantum dot light emitting diode (QLED) device, and in this case the light emitting layer is made of a quantum dot light emitting material. Each of the light emitting devices 4 is configured to emit light in a predetermined color.

In some embodiments, as shown in FIG. 6, an edge of the first sidewall 301 proximal to the base substrate 1 includes a first portion e1, and an edge of the first sidewall 301 away from the base substrate 1 includes a second portion e2. Both of the first portion e1 and the second portion e2 extend along the first direction Y, and orthographic projections of the first portion e1 and the second portion e2 on the base substrate 1 does not overlap an orthographic projection of the first protrusion 31 on the base substrate 1. An orthographic projection of an extension line of the second portion e2 on the base substrate 1 passes through the orthographic projection of the first protrusion 31 on the base substrate 1. That is, the first protrusion 31 can completely cut off the first sidewall 301 in the second direction X, so as to avoid the conductive material residue formed on the connection surface between the first protrusion 31 and the first sidewall 301, and to avoid the phenomenon that the first protrusion 31 cannot cut off the conductive material residue on the first sidewall 301.

It should be noted that the orthographic projection of the first protrusion 31 on the base substrate 1 may be a circle, or a trapezoid, a triangle, a quadrangle, or the like, which is not particularly limited by the embodiment of the present disclosure.

In some embodiments, as shown in FIG. 7, the display panel further includes a plurality of first cushion blocks 6 located between the base substrate 1 and the planarization layer 3, and an orthographic projection of the first protrusion 31 on the base substrate 1 covers an orthographic projection of the first cushion block 6 on the base substrate 1. That is, during the manufacturing process of the display panel, the first cushion block 6 is formed first, and then the planarization layer 3 is formed such that a portion of the planarization layer 3 opposite to the first cushion block 6 protrudes away from the first cushion block 6, thereby forming the first protrusion 31.

In some embodiments, the first cushion block 6 is made of the same material as the source/drain electrode of the thin film transistor 5, so that the first cushion block 6 and the source/drain electrode of the thin film transistor 5 can be formed in the same manufacturing step. The source and drain electrodes are closer to the planarization layer 3, thereby facilitating the formation of the first protrusion 31. In addition, the first cushion block 6 may also be made of the same material as the gate electrode of the thin film transistor 5, which is not limited in the embodiment of the present disclosure.

As shown in FIG. 6, an orthographic projection of the extension line of the second portion e2 on the base substrate 1 passes through an orthographic projection of the first protrusion 31 on the base substrate 1, so that the conductive material residue on the first protrusion 31 is reduced as much as possible during the patterning process of the first electrode layer.

In some embodiments, as shown in FIG. 7, an angle R between the first sidewall and the bottom of the groove ranges from 110° to 170°. Optionally, R may be any one of 110°, 120°, 130°, 140°, 150°, 160°, or 170°.

In some embodiments, as shown in FIG. 6, each of the repeating units 21 includes two electrode sets 22 arranged along the second direction X, and the connection electrodes 232 of the two electrode sets 22 are respectively located in two adjacent grooves 30 arranged along the second direction X. The first protrusions 31 are formed on the first sidewalls 301 of the grooves 30 so as to prevent the formation of a continuous conductive material residue on the first sidewalls 301, and further prevent the connection of the connection electrodes 232 of the adjacent electrode blocks 23 in the same electrode set 22 and the cross color phenomenon in the light emitting layer 41 of the adjacent electrode blocks 23.

It should be noted that each of the electrode sets 22 may include a plurality of electrode blocks 23, for example, three electrode blocks 23 or four electrode blocks 23. The first protrusion 31 needs to be correspondingly disposed between every two adjacent ones of the electrode blocks 23 to avoid the connection of the connection electrodes 232 of the adjacent electrode blocks 23 and the cross color phenomenon of the light emitting layers 41 of the adjacent electrode blocks 23.

In some embodiments, the orthographic projection of the first protrusion 31 on the base substrate 1 does not overlap the orthographic projection of the first electrode 231 on the base substrate 1, that is, the first electrode 231 is still disposed in a flat region on the planarization layer without being affected by the first protrusion 31.

In some embodiments, as shown in FIG. 6, the groove 30 further has a second sidewall 302 extending along the second direction X, and the planarization layer 3 further has at least one second protrusion 32, and an orthographic projection of the second protrusion 32 on the base substrate 1 covers in the first direction Y an orthographic projection of the second sidewall 302 on the base substrate 1. The second sidewall 302 in the groove 30 is connected to the first sidewalls 301 on both sides of the second sidewall 302 in the second direction X, each first sidewall 301 is provided with a connection electrode 232, and the connection electrodes 232 on different sidewalls belong to different electrode blocks 23, so that the second protrusion 32 is formed on the second sidewall 302 to prevent the connection electrodes 232 of different electrode blocks 23 on both sides of the groove 30 in the second direction X from being connected to each other via the second sidewall 302.

In some embodiments, the display panel further includes a plurality of second cushion blocks (not shown), each of the second cushion blocks is located between the base substrate 1 and the planarization layer 3, and an orthographic projection of the second protrusion 32 on the base substrate 1 covers an orthographic projection of the second cushion block on the base substrate 1.

In some embodiments, the material of the second cushion block may be the same as the material of the source or drain electrode of the thin film transistor 5, or may also be the same as the material of the gate electrode of the thin film transistor 5, which is not limited in the embodiments of the present disclosure. The second cushion block in the embodiment of the present disclosure belongs to the same inventive concept as the first cushion block 6, and will not be described herein again.

Figure 8:
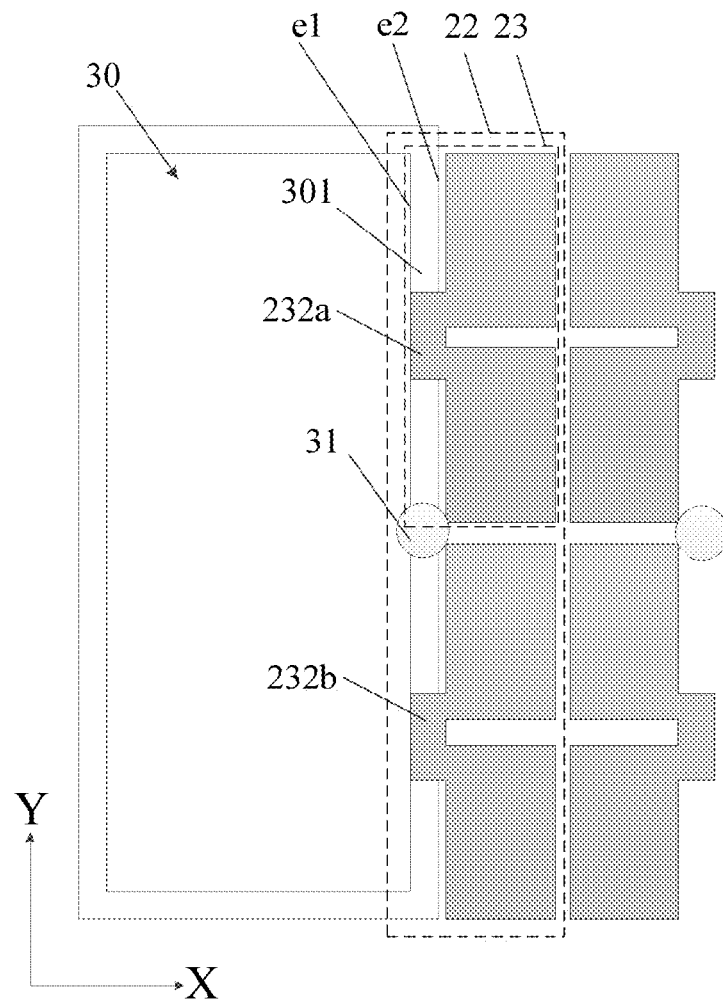
FIG. 8 is a plan view showing a portion of a display panel in an embodiment of the present disclosure.

FIG. 8 is a plan view showing a portion of a display panel in an embodiment of the present disclosure, and in some embodiments, as shown in FIG. 8, a first protrusion 31 is formed at a position near a spacing region between every two adjacent electrode blocks 23 in the same electrode set 22.

It should be noted that the position near the spacing region between every two adjacent electrode blocks 23 in the same electrode set 22 refers to a position in the first sidewall 301 adjacent to the spacing region between every two adjacent electrode blocks 23 in the same electrode set 22. That is, an orthographic projection of a boundary between two adjacent electrode blocks 23 on the base substrate 1 passes through an orthographic projection of the first protrusion 31 on the base substrate 1.

In addition, the first protrusion 31 may cut off the residual conductive material on the first sidewall 301, so as to avoid the short circuit of the connection electrode 232 of the adjacent electrode blocks 23 and the cross color phenomenon between the light emitting layers 41 of the adjacent electrode blocks 23. Therefore, the first protrusion 31 may be disposed at any position between the connection electrode 232a and the connection electrode 232b in FIG. 8, so as to cut off the residual conductive material on the first sidewall 301 between the two connection electrodes, avoid the connection between the two connection electrodes, and further avoid the cross color phenomenon caused by the short circuit of the first electrodes of the light emitting devices in different colors, thereby improving the display effect of the display panel.

An embodiment of the present disclosure further provides a display apparatus, which includes the display panel described above.

The display apparatus may be: any product or component with a display function, such as a mobile phone, a tablet computer, a television, a monitor, a notebook computer, a digital photo frame, a navigator, etc., which is not limited in the present disclosure.

It will be understood that the above embodiments are merely exemplary embodiments employed to illustrate the principles of the present disclosure, and the present disclosure is not limited thereto. It will be apparent to those skilled in the art that various changes and modifications can be made therein without departing from the spirit and essence of the present disclosure, and these changes and modifications are to be considered within the scope of the present disclosure.

What is claimed is:

1. A display panel, comprising: a base substrate, an electrode layer and a planarization layer between the base substrate and the electrode layer; wherein
the electrode layer comprises a plurality of repeating units, each of the plurality of repeating units comprises at least one electrode set, each of the at least one electrode set comprises a plurality of electrode blocks arranged along a first direction, each of the plurality of electrode blocks comprises a plurality of first electrodes arranged along the first direction and a connection electrode connected between every two adjacent ones of the plurality of first electrodes;
the planarization layer is provided with a plurality of grooves, a corresponding groove of the plurality of grooves is on at least one side of the repeating unit in a second direction, the groove comprises a first sidewall extending along the first direction, and at least a portion of the connection electrode is on the first sidewall; the second direction intersecting the first direction; and
the planarization layer further comprises a plurality of first protrusions, orthographic projections of the plurality of first protrusions on the base substrate each cover in the second direction an orthographic projection of the first sidewall on the base substrate, and a corresponding one of the plurality of first protrusions is between the connection electrodes of at least two adjacent electrode blocks in the same electrode set,
the groove further comprises a second sidewall extending along the second direction,
the planarization layer further comprises at least one second protrusion, and
an orthographic projection of the at least one second protrusion on the base substrate covers in the first direction an orthographic projection of the second sidewall on the base substrate.

2. The display panel of claim 1, wherein an edge of the first sidewall proximal to the base substrate comprises a first portion, an edge of the first sidewall away from the base substrate comprises a second portion, each of the first portion and the second portion extends along the first direction, and an orthographic projection of each of the first portion and the second portion on the base substrate does not overlap the orthographic projection of the first protrusion on the base substrate; and
an orthographic projection of an extension line of the second portion on the base substrate passes through the orthographic projection of the first protrusion on the base substrate.

3. The display panel of claim 1, further comprising:
a plurality of first cushion blocks between the base substrate and the planarization layer, and
an orthographic projection of each of the plurality of first protrusions on the base substrate covers an orthographic projection of a corresponding one of the plurality of first cushion blocks on the base substrate.

4. The display panel of claim 3, further comprising a thin film transistor between the planarization layer and the base substrate, wherein
the first electrode is electrically connected to a drain electrode of the thin film transistor through a via hole in the planarization layer, and the plurality of first cushion blocks are made of the same material as the drain electrode or a gate electrode of the thin film transistor.

5. The display panel of claim 1, wherein each of the plurality of repeating units comprises two electrode sets arranged in the second direction, and the connection electrodes of the two electrode sets are respectively located in two adjacent grooves arranged in the second direction among the plurality of grooves.

6. The display panel of claim 1, wherein an orthographic projection of the first protrusion on the base substrate does not overlap an orthographic projection of the first electrode on the base substrate.

7. The display panel of claim 1, further comprising a plurality of second cushion blocks each between the base substrate and the planarization layer, wherein
an orthographic projection of each of the at least one second protrusion on the base substrate covers an orthographic projection of a corresponding one of the plurality of second cushion blocks on the base substrate.

8. The display panel of claim 7, further comprising a thin film transistor between the planarization layer and the base substrate; wherein
the plurality of second cushion blocks are made of the same material as a drain electrode or a gate electrode of the thin film transistor.

9. The display panel of claim 1, further comprising:
a plurality of light emitting devices, each of which comprises the first electrode, a light emitting layer, and a second electrode, the second electrode being located on a side of the first electrode away from the base substrate, the light emitting layer being located between the first electrode and the second electrode; wherein
the light emitting layers corresponding to the plurality of first electrodes in the same electrode block emit light in a same color.

10. The display panel of claim 1, wherein
the plurality of repeating units are arranged in an array, one of the first direction and the second direction is a row direction, and the other is a column direction; and
the groove is between every two adjacent ones in the second direction of the plurality of repeating units.

11. The display panel of claim 1, wherein an angle between the first sidewall and a bottom of the groove ranges from 110° to 170°.

12. The display panel of claim 1, wherein a corresponding one of the plurality of first protrusions is located in a spacing region between every two adjacent electrode blocks in the same electrode set.

13. The display panel of claim 1, wherein the plurality of first electrodes and the connection electrode in the same electrode block are formed as a one-piece structure.

14. A display apparatus, comprising the display panel of claim 1.

15. A display panel, comprising: a base substrate, an electrode layer and a planarization layer between the base substrate and the electrode layer; wherein
the electrode layer comprises a plurality of repeating units, each of the plurality of repeating units comprises at least one electrode set, each of the at least one electrode set comprises a plurality of electrode blocks arranged along a first direction, each of the plurality of electrode blocks comprises a plurality of first electrodes arranged along the first direction and a connection electrode connected between every two adjacent ones of the plurality of first electrodes;
the planarization layer is provided with a plurality of grooves, a corresponding groove of the plurality of grooves is on at least one side of the repeating unit in a second direction, the groove comprises a first sidewall extending along the first direction, and at least a portion of the connection electrode is on the first sidewall; the second direction intersecting the first direction; and
the planarization layer further comprises a plurality of first protrusions, orthographic projections of the plurality of first protrusions on the base substrate each cover in the second direction an orthographic projection of the first sidewall on the base substrate, and a corresponding one of the plurality of first protrusions is between the connection electrodes of at least two adjacent electrode blocks in the same electrode set,
an edge of the first sidewall proximal to the base substrate comprises a first portion, an edge of the first sidewall away from the base substrate comprises a second portion, each of the first portion and the second portion extends along the first direction, and an orthographic projection of each of the first portion and the second portion on the base substrate does not overlap the orthographic projection of the first protrusion on the base substrate; and an orthographic projection of an extension line of the second portion on the base substrate passes through the orthographic projection of the first protrusion on the base substrate,
the display panel further comprises a plurality of first cushion blocks between the base substrate and the planarization layer, an orthographic projection of each of the plurality of first protrusions on the base substrate covers an orthographic projection of a corresponding one of the plurality of first cushion blocks on the base substrate, and a corresponding one of the plurality of first protrusions is located in a spacing region between every two adjacent electrode blocks in the same electrode set,
the groove further comprises a second sidewall extending along the second direction, the planarization layer further comprises at least one second protrusion, and an orthographic projection of the at least one second protrusion on the base substrate covers in the first direction an orthographic projection of the second sidewall on the base substrate,
the display panel further comprises a plurality of second cushion blocks each between the base substrate and the planarization layer, wherein an orthographic projection of each of the at least one second protrusion on the base substrate covers an orthographic projection of a corresponding one of the plurality of second cushion blocks on the base substrate.

* * * * *